United States Patent
Sato et al.

(10) Patent No.: US 9,466,556 B2
(45) Date of Patent: Oct. 11, 2016

(54) LEAD FRAME AND SEMICONDUCTOR DEVICE

(71) Applicant: SHINKO ELECTRIC INDUSTRIES CO., LTD., Nagano-ken (JP)

(72) Inventors: Harunobu Sato, Nagano (JP); Takashi Yoshie, Nagano (JP); Susumu Kurashima, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 244 days.

(21) Appl. No.: 14/221,796

(22) Filed: Mar. 21, 2014

(65) Prior Publication Data

US 2014/0291827 A1   Oct. 2, 2014

(30) Foreign Application Priority Data

Mar. 26, 2013   (JP) .................................. 2013-064341

(51) Int. Cl.
*H01L 23/495*   (2006.01)
*H01L 21/48*   (2006.01)

(52) U.S. Cl.
CPC ..... *H01L 23/49541* (2013.01); *H01L 21/4842* (2013.01); *H01L 23/49582* (2013.01); *H01L 23/49513* (2013.01); *H01L 23/49551* (2013.01); *H01L 23/49565* (2013.01); *H01L 2224/32245* (2013.01); *H01L 2224/45144* (2013.01); *H01L 2224/45147* (2013.01); *H01L 2224/48091* (2013.01); *H01L 2224/48247* (2013.01); *H01L 2224/48465* (2013.01); *H01L 2224/73265* (2013.01)

(58) Field of Classification Search
CPC .............. H01L 2224/48247; H01L 2924/181; H01L 23/49582; H01L 21/4821
See application file for complete search history.

(56) References Cited

U.S. PATENT DOCUMENTS

| | | | | |
|---|---|---|---|---|
| 5,041,901 A | * | 8/1991 | Kitano | H01L 23/49582 257/669 |
| 5,329,158 A | * | 7/1994 | Lin | H05K 3/3426 257/666 |
| 5,909,053 A | * | 6/1999 | Fukase | H01L 21/4821 257/666 |
| 6,518,653 B1 | * | 2/2003 | Takagi | H01L 23/49582 257/666 |
| 6,593,643 B1 | * | 7/2003 | Seki | H01L 23/49582 257/677 |
| 2002/0075634 A1 | * | 6/2002 | Uenishi | H01G 9/012 361/523 |
| 2004/0232534 A1 | * | 11/2004 | Seki | C25D 5/02 257/678 |

FOREIGN PATENT DOCUMENTS

| | | |
|---|---|---|
| JP | H01-102946 | 4/1989 |
| JP | 10-74879 | 3/1998 |
| JP | 2003-78097 | 3/2003 |

* cited by examiner

*Primary Examiner* — Selim Ahmed
*Assistant Examiner* — John M Parker
(74) *Attorney, Agent, or Firm* — Fish & Richardson P.C.

(57) ABSTRACT

A lead frame includes an outer lead and a plating layer that covers a lower surface and side surfaces of the outer lead. The plating layer does not cover the upper surface of the outer lead. A frame base material is exposed from the plating layer at the upper surface of the outer lead.

14 Claims, 4 Drawing Sheets

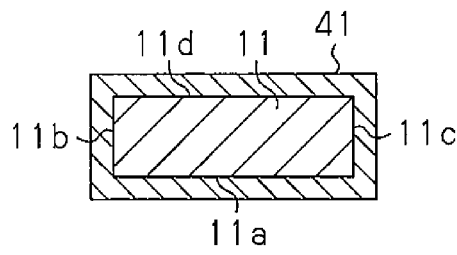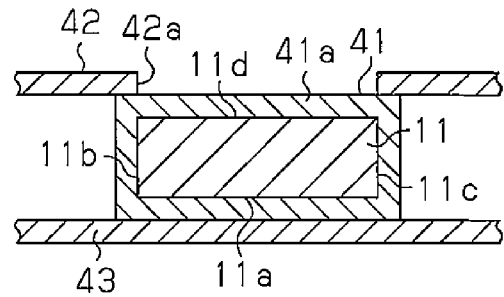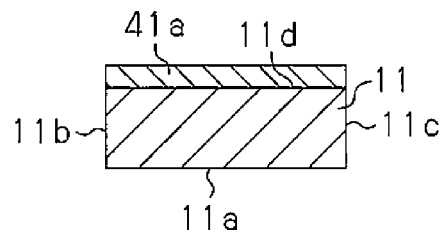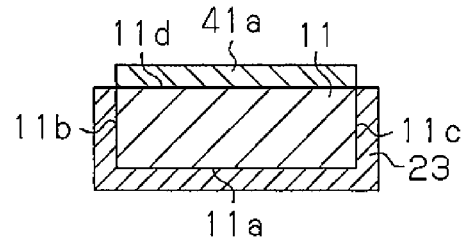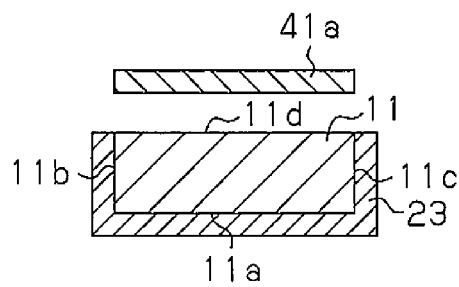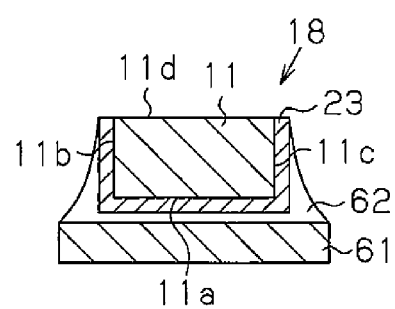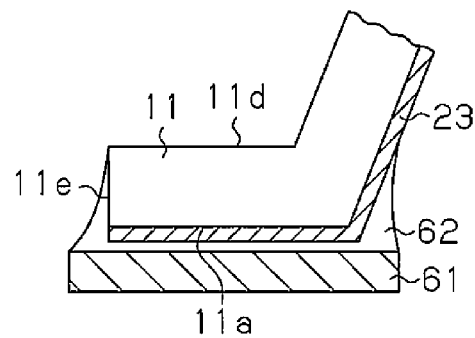

LEAD FRAME AND SEMICONDUCTOR DEVICE

CROSS-REFERENCE TO RELATED APPLICATIONS

This application is based upon and claims the benefit of priority from prior Japanese Patent Application No. 2013-064341, filed on Mar. 26, 2013, the entire contents of which are incorporated herein by reference.

FIELD

The present disclosure relates to lead frames and semiconductor devices.

BACKGROUND

A lead frame is used to mount semiconductor elements on a substrate. A semiconductor device is manufactured by mounting the semiconductor elements on die pads of the lead frame and then encapsulating the semiconductor elements and the lead frame with a resin material. For example, a lead frame used for a surface-mount type semiconductor device includes die pads, on which semiconductor elements are mounted, and outer leads, which function as external connection terminals of the semiconductor device. The outer leads are soldered to pads (mount subjects), which are formed on a substrate or the like (for example, refer to Japanese Laid-Open Patent Publication Nos. 2003-78097 and 10-74879).

SUMMARY

The present disclosure is directed to a lead frame that includes an outer lead having satisfactory bonding properties.

One aspect of the present disclosure is a lead frame including a frame base material and a plating layer. The frame base material includes connection leads and a dam bar connecting the connection leads. Each connection lead includes an inner lead, which is located at an inner side of the dam bar, and an outer lead, which is located at an outer side of the dam bar. The plating layer covers either an upper surface or a lower surface of each outer lead and side surfaces of each outer lead. The frame base material is exposed from the plating layer at the other one of the upper surface and the lower surface of each outer lead The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 3A to 3E are cross-sectional views illustrating a method for manufacturing the lead frame;

FIGS. 4A and 4B are schematic views illustrating the solder connecting the outer lead of the present embodiment to a pad;

DESCRIPTION OF EMBODIMENTS

Figure 1A:
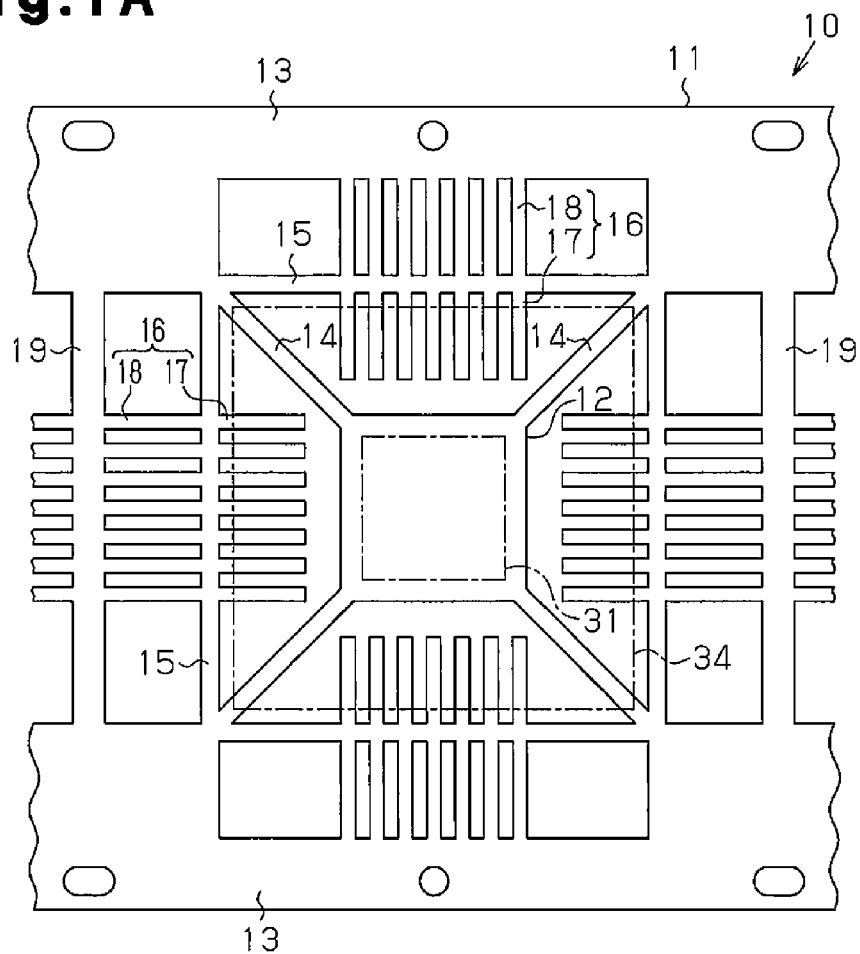
FIG. 1A is a partial plan view of a lead frame.

One embodiment will now be described. Features in the drawings are illustrated for simplicity and clarity and have not necessarily been drawn to scale. In the drawings, like numerals are used for like elements throughout. To facilitate understanding, hatching lines may not be illustrated in the cross-sectional drawings.

Referring to FIG. 1A, a lead frame 10 of the present embodiment includes a frame base material 11 that is used as a substrate for a quad flat package (QFP). The frame base material 11 may be formed from, for example, copper (CU), or a CU alloy. Further, the frame base material 11 may be obtained by, for example, stamping or etching a metal plate or an alloy plate.

The frame base material 11 includes a die pad 12 on which a semiconductor element 31 is mounted. The die pad 12 may be, for example, a flat tetragonal plate. The die pad 12 is supported by support bars 14 that are connected to two rails 13, which extend in the longitudinal direction of the frame base material 11. Further, the die pad 12 is surrounded by dam bars 15 (also referred to as tie bars) and connection leads 16. The dam bars 15 connect the connection leads 16. Each connection lead 16 includes an inner lead 17, which inwardly extends toward the die pad 12 from the corresponding dam bar 15, and an outer lead 18, which outwardly extends from the corresponding dam bar 15. Each outer lead 18 has a distal end connected to a rail 13 or an inner frame 19, which bridges the two rails 13. In the illustrated example, the two inner frames 19 extend in a direction perpendicular to the longitudinal direction of the rails 13 in order to connect the two rails 13. The die pad 12 is located between the two inner frames 19. The die pad 12, the support bars 14, the dam bars 15, and the connection leads 16 (inner leads 17 and outer leads 18) are formed between openings in the frame base material 11. In FIG. 1A, the tetragonal broken lines surrounding the distal ends of the inner leads 17 indicates an encapsulation resin area that is encapsulated by an encapsulation resin 34 (refer to FIG. 2). The die pad 12 and the inner leads 17 are embedded in the encapsulation resin 34, and the outer leads 18 are exposed from the encapsulation resin 34.

Figure 1B:
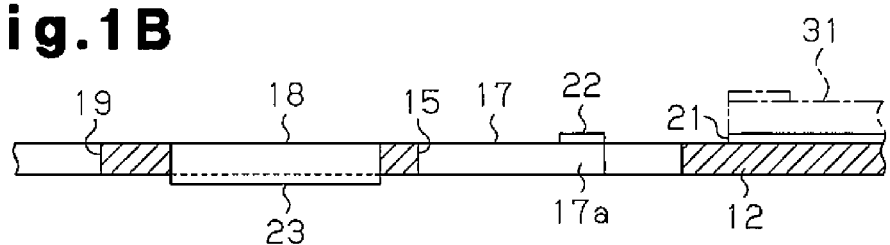
FIGS. 1B and 1C are enlarged cross-sectional views of a portion of the lead frame illustrated in FIG. 1A.

Referring to FIG. 1B, the die pad 12 includes a plating layer 21 that covers one surface (e.g., upper surface) of the frame base material 11. The plating layer 21 may be, for example, a nickel (Ni) plating layer or a silver (Ag) plating layer. FIG. 1B illustrates the upper surface of the lead frame 10 as one example of a mount side on which a semiconductor element 31 is mounted. The lower surface of the lead frame 10 is one example of a non-mount side that is opposite to the mount side.

Each inner lead 17 includes a distal end 17a that forms an inner terminal 22 at the mount side of the lead frame 10. The inner terminal 22 functions as a wire bonding portion. A metal wire 33 (bonding wire) connects the inner terminal 22 to a pad 31a of the semiconductor element 31 on the die pad 12. The inner terminal 22 may be, for example, a plating layer.

Figure 1C:
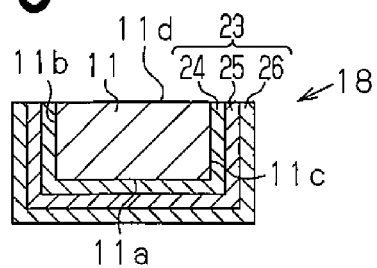

As illustrated in FIGS. 1B and 1C, each outer lead 18 includes a plating layer 23. The plating layer 23 covers a lower surface 11a and both side surfaces 11b and 11c of the outer lead 18. The plating layer 23 does not cover an upper surface 11d of the outer lead 18. Thus, the upper surface of the frame base material 11 (e.g., copper or copper alloy) is exposed from the upper surface 11d of the outer lead 18. As illustrated in FIG. 1C, in a cross-section of the outer lead 18, the upper end of the plating layer 23 may be flush with the upper surface 11d of the outer lead 18 or the upper surface of the frame base material 11.

The plating layer 23 has a three-layer structure. A first plating layer 24 covers the lower surface 11a and the side surfaces 11b and 11c of the outer lead 18. A second plating layer 25 covers the first plating layer 24. A third plating layer 26 covers the second plating layer 25. In the present embodiment, the first plating layer 24 is a nickel (Ni) plating layer, the second plating layer 25 is a palladium (Pd) plating layer, and the third plating layer 26 is a gold (Au) plating layer. None of the first to third plating layers 24 to 25 cover the upper surface 11d of the outer lead 18. A nickel alloy may be used for the first plating layer 24. Further, a palladium alloy may be used for the second plating layer 25, and a gold alloy may be used for the third plating layer 26.

In the illustrated example, like the plating layer 23 of the outer lead 18, the inner terminal 22 has a three-layer structure that includes the first to third plating layers 24 to 26. Alternatively, the inner terminal 22 may have a two-layer structure or have four or more layers including a silver (Ag) plating layer. In the same manner as the plating layer 23 of the outer lead 18, the plating layer 21 may have a three-layer structure (nickel plating layer, palladium plating layer, and gold plating layer). Alternatively, the plating layer 21 may have a two-layer structure or have four or more layers.

A process for manufacturing the lead frame 10 illustrated in FIG. 1A will now be described.

First, a metal plate of copper, copper alloy, or the like is stamped or etched to form the frame base material 11 (frame formation).

Then, a liquid resist is applied to the entire frame base material 11, and prebaking is performed to form a resist film (resist application). The liquid resist is hardened by light having a predetermined wavelength (e.g., ultraviolet light).

The liquid resist is exposed, through a photomask, and developed. Then, a predetermined portion of the resist film that has not been irradiated with the light having the predetermined wavelength is removed to selectively expose a predetermined portion in the surface of the frame base material 11. The exposed predetermined portion is where a plating layer is formed.

The plating layer 23 is formed on the exposed predetermined portion. For example, a nickel (Ni) plating is formed on the exposed predetermined portion of the frame base material 11. The plating is formed by performing, for example, electrolytic plating, electroless plating, or sputtering.

Then, a palladium (Pd) plating is formed on the nickel plating, and a metal (Au) plating is formed on the palladium plating. Subsequently, the resist layer is removed to expose the surface of the frame base material 11 excluding the predetermined portion where the plating layer 23 is formed.

Such a process forms the lead frame 10 that is partially plated. The plated portion includes the lower surface 11a and the side surfaces 11b and 11c of the frame base material 11 where the outer lead 18 is formed.

A process for forming the plating layer 23 in the outer lead 18 will now be described with reference to FIGS. 3A to 3E.

First, referring to FIG. 3A, a liquid resist is applied to the frame base material 11 to form a resist film 41 on the entire frame base material 11.

Then, referring to FIG. 3B, masks 42 and 43 are used so that the resist film 41a on the upper surface 11d of the frame base material 11 where an opening 42a is formed in the mask 42 is selectively exposed to light having a predetermined wavelength. The exposure hardens the resist film 41a on the upper surface 11d.

Referring to FIG. 3C, development is performed to remove the unhardened resist film. This exposes the lower surface 11a and the side surfaces 11b and 11c of the frame base material 11.

Then, referring to FIG. 3D, the plating layer 23 is formed on the lower surface 11a and the side surfaces 11b and 11c of the frame base material 11. As described above, the plating layer 23 includes a nickel plating layer, a palladium plating layer, and a gold plating layer (refer to FIG. 1C).

Referring to FIG. 3E, the resist film 41a is removed from the upper surface 11d of the frame base material 11. For example, defoliation liquid is used to remove the resist film 41a. In another example, an asking treatment or the like may be performed to remove the resist film 41a. This forms the outer lead 18 in the frame base material 11 where the plating layer 23 covers the lower surface 11a and the side surfaces 11b and 11c but not the upper surface 11d.

A semiconductor device that includes the lead frame 10 will now be described.

Figure 2A:
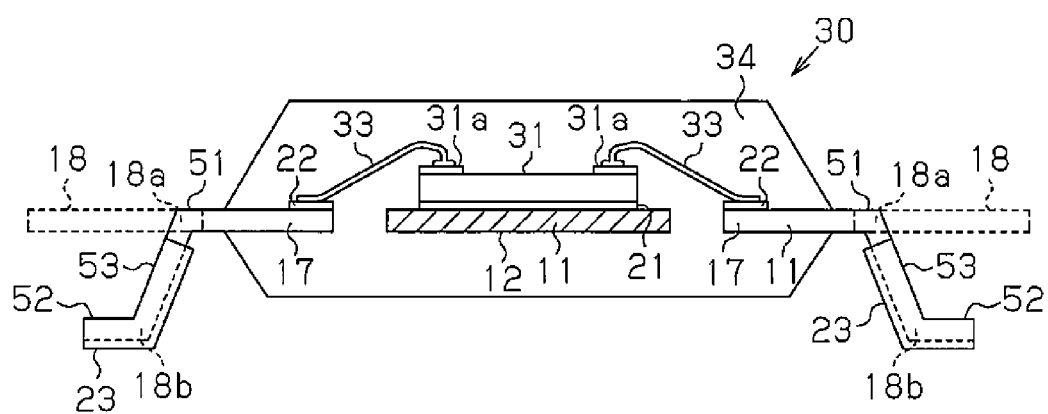
FIG. 2A is a schematic cross-sectional view of a semiconductor device.

As illustrated in FIG. 2A, a resin-encapsulated type semiconductor device 30 includes a lead frame 10 and a semiconductor element 31. The package structure of the semiconductor device 30 is, for example, a quad flat package (QFP). The semiconductor element 31 is adhered to the upper surface of the die pad 12 by an adhesive agent (not illustrated). The adhesive agent is, for example, a silver (Ag) paste.

Metal wires 33 (bonding wires) connect the pads 31a of the semiconductor element 31 to the inner terminals 22 of the inner leads 17. The metal wires 33 are, for example, fine wires of gold, copper, aluminum (Al), or the like. The encapsulation resin 34 encapsulates a portion including the semiconductor element 31, the metal wires 33, the die pad 12, and the distal ends of the inner leads 17. In the semiconductor device 30, each connection lead 16 including the outer lead 18 and the basal end of the inner lead 17 is exposed from the encapsulation resin 34.

Although there is no restriction, the semiconductor element 31 may be, for example, an LSI chip. In the illustrated example, a single semiconductor element 31 is mounted on the die pad 12. However, when necessary, two or more semiconductor elements may be mounted on the die pad 12. Further, any active element or passive element may be mounted on the die pad 12 in lieu of or in combination with the semiconductor element 31. Although there is no restriction, the metal wire 33 may be, for example, a Cu wire, an Au wire, an aluminum (Al) wire, or the like. Although there is no restriction, the encapsulation resin 34 may be, for example, an epoxy resin, a polyimide resin, a phenol resin, an acrylic rein, or the like.

Figure 2B:
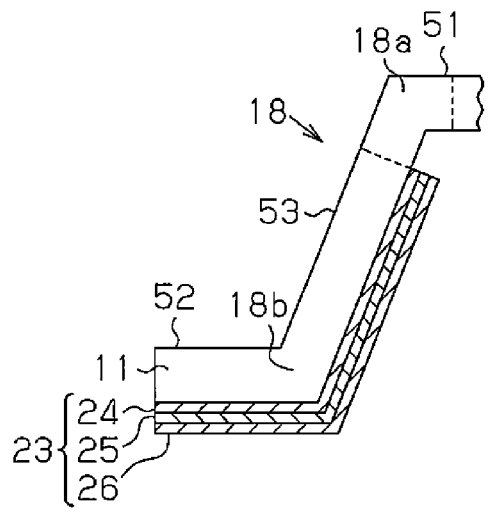
FIGS. 2B and 2C are schematic views illustrating an outer lead of the semiconductor device illustrated in FIG. 2A.

As illustrated in FIG. 2B, the outer lead 18 may include a first bent portion 18a, which is formed at the side closer to the inner lead 17, and a second bent portion 18b, which is formed at the outer side of the first bent portion 18a. Due to the arrangement of the bent portions 18a and 18b, the outer lead 18 resembles a gullwing. The first bent portion 18a is set at a predetermined level, which may be where the dam bar 15 is located (refer to FIG. 1A).

Referring to FIG. 2A, the section of each connection lead 16 horizontally extending out of the encapsulation resin 34 may be referred to as a shoulder 51. The section from the second bent portion 18b to the distal end of the outer lead 18 may be referred to as a junction 52. The mount surface (lower surface) of the junction 52 is soldered and mounted on a pad of a mount substrate, such as a printed wiring board. The section of the connection lead 16 between the shoulder 51 and the junction 52 is referred to as a leg 53. The leg 53 is formed to support the encapsulation resin 34 at a predetermined height from the substrate serving as the mount subject.

Figure 2C:
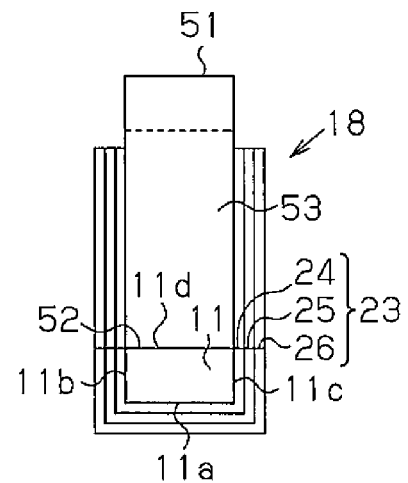

Referring to FIG. 2B, the plating layer 23 is formed on the leg 53 continuously from the lower surface of the junction 52. As illustrated in FIG. 2C, the plating layer 23 covers the lower surface 11a and the side surfaces 11b and 11c of the frame base material 11 at least at the junction 52. The frame base material 11, which is the base material of the outer lead 18, is exposed at the upper surface of the junction. The exposed surface of the frame base material 11 is oxidized when the encapsulation resin 34 and the like undergoes a heat treatment. This forms an oxide layer, such as a copper oxide layer, on the upper surface 11d of the frame base material 11.

The operation of the lead frame 10 and the semiconductor device 30 will now be described.

As illustrated in FIG. 4A, the outer lead 18 is bonded by solder 62 to a mount subject such as a pad 61 of a substrate or the like (not illustrated). At the outer lead 18, the plating layer 23 is formed on the lower surface 11a and the side surfaces 11b and 11c of the frame base material 11. Thus, the lower surface and side surfaces of the outer lead 18 have satisfactory wettability with respect to solder.

The plating layer 23 covers each side surface of the outer lead 18 to the upper end of the side surface. Even when the amount of the solder 62 is small, the solder 62 easily reaches the upper end of the side surface of the outer lead 18. As a result, the solder 62 easily forms a desirable fillet. Accordingly, the solder 62 increases the connection reliability of the outer lead 18 and the mount subject.

The plating layer 23 does not cover the upper surface of the outer lead 18, that is, the upper surface 11d of the frame base material 11. The upper surface 11d of the frame base material 11 is oxidized when the encapsulation resin 34 and the like undergoes a heat treatment. This forms an oxide layer (copper oxide layer) on the upper surface 11d. The wettability of such an oxide layer to solder is poor. Thus, the oxide layer on the upper surface of the outer lead 18 limits or reduces the flow of solder onto the upper surface of the outer lead 18.

In the example illustrated in FIG. 4B, the plating layer 23 is formed between the first and second bent portions 18a and 18b of the outer lead 18 on the inclined lower surface of the frame base material 11. Due to the plating layer 23, the solder 62 rises along the inclined lower surface of the frame base material 11 and forms a desirable fillet.

Further, in the example illustrated in FIG. 4B, the plating layer 23 is not formed on a distal surface 11e of the frame base material 11. The distal ends of the outer leads 18 are cut from the lead frame 10 when singulating the semiconductor device 30 after forming the encapsulation resin 34. Thus, in contrast with the upper surface 11d of the frame base material 11, the distal surface 11e is subtly affected by the heat treatment. Accordingly, the distal surface 11e of the frame base material 11 is completely or substantially free from an oxide layer. Even if an oxide layer is formed on the distal surface 11e, the oxide layer would cover only a portion of the distal surface or the oxide layer would be too thin to lower the wettability. In this case, when performing soldering, the solder 62 would flow and rise along the distal surface 11e of the frame base material 11 and form a desirable fillet.

Figure 5A:
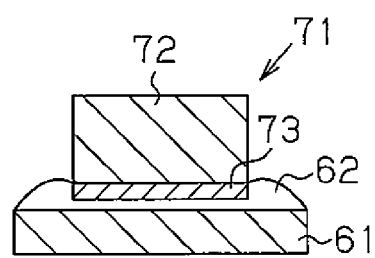
FIGS. 5A and 5B are schematic views each illustrating the solder connecting an outer lead of a comparative example to a pad.

Comparison examples will now be described. FIG. 5A illustrates a lead 71 of a first comparative example including a plating layer 73 formed only on the lower surface (mount surface) of a base material 72. In the first example, a plating layer is not formed on the side surfaces of the lead 71 (base material 72). The exposed side surfaces of the base material 72 are covered by an oxidized film (e.g., copper oxide) formed when an encapsulation resin undergoes a heat treatment. Due to the oxidized film, the side surfaces of the lead 71 (base material 72) are completely or substantially free from the solder 62. In the first comparative example, a solder fillet is not formed. Accordingly, the connection reliability of the lead 71 and the pad 61 is relatively low in the first comparative example.

Figure 5B:
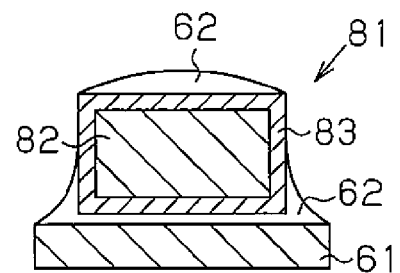

FIG. 5B illustrates a lead 81 of a second comparative example including a plating layer 83 formed on the lower surface, the side surfaces, and the upper surface of a base material 82. In the second comparative example, the solder 62 flows onto and covers the upper surface of the lead 81. Thus, the amount of the solder 62 may be insufficient between the lower surface of the lead 81 and the pad 61 and/or at the side surfaces of the lead 81. This would hinder the formation of a desirable solder fillet. Accordingly, the connection reliability of the lead 81 and the pad 61 is relatively low in the second comparative example.

The plating layer 83 entirely covering the lead 81 (base material) is, for example, a three-layer structure including a nickel plating layer (underlayer), a palladium plating layer, and a gold plating layer. The plating layer 83 increases the resistance relative to high-frequency components of signals transmitted by the lead 81. Accordingly, the plating layer 83 that covers the entire surface of the lead 81 (base material 82) lowers the signal quality of the lead 81.

In contrast, the connection lead 16 of the present embodiment includes the outer lead 18, of which the lower surface 11a and the side surfaces 11b and 11c of the frame base material 11 at the junction 52 is covered by the plating layer 23, and the inner lead 17, of which the upper surface is covered by the inner terminal 22 (plating layer), as illustrated in FIGS. 2A to 2C. Accordingly, the resistance of the connection lead 16 relative to high-frequency components in the present embodiment is lower than the lead 81, which is entirely covered by the plating layer 83 (refer to FIG. 5B). In the connection lead 16 of the present embodiment, the decrease in the signal quality of the plating layer 23 is limited. In this manner, high-quality signal transmission may be achieved, while improving the connection reliability.

The present embodiment has the advantages described below.

(1) The outer lead 18 of the lead frame 10 includes the plating layer 23 that covers the lower surface 11a and the side surfaces 11b and 11c of the frame base material 11. The plating layer 23 does not cover the upper surface of the outer lead 18. Accordingly, when mounting the semiconductor device 30, the solder 62 flows and rises along the side surfaces of the outer lead 18 due to the plating layer 23 and forms a satisfactory fillet. Thus, when mounting the semiconductor device 30, high connection reliability may be achieved.

In the illustrated example, the frame base material 11 of the lead frame 10 includes the connection leads 16, which are connected to one another by the dam bars 15. Each connection lead 16 includes the inner lead, which extends toward the inner side from the corresponding dam bar 15, and the outer lead 18, which extends toward the outer side from the corresponding dam bar 15. The outer lead 18 includes the plating layer 23, which covers the lower surface 11*a* and the side surfaces 11*b* and 11*c* of the frame base material 11. The plating layer 23 does not cover the upper surface 11*d* of the frame base material 11. Thus, copper or copper alloy, which is the base material of the outer lead 18, is exposed at the upper surface 11*d*. In this example, a portion of the outer lead 18 functions as the junction 52, which is used to mount the semiconductor device 30 manufactured with the lead frame 10 to the mount subject. At the junction 52, the plating layer 23 covers the lower surface 11*a* and the side surfaces 11*b* and 11*c* of the frame base material 11. Accordingly, when mounting the semiconductor device 30, the solder 62 flows and rises along the side surfaces of the junction due to the plating layer 23 and forms a satisfactory fillet. Thus, when mounting the semiconductor device 30, high connection reliability may be achieved.

(2) At the junction 52, the plating layer 23 does not cover the upper surface 11*d* of the frame base material 11. The upper surface 11*d* is covered by an oxidized film formed when an encapsulation resin or the like undergoes a heat treatment. The oxidized film has low wettability with respect to the solder 62. Accordingly, the solder 62 does not flow onto the upper surface of the junction 52. Thus, the solder 62 used for bonding does not become insufficient, and a desirable fillet may be formed.

It should be apparent to those skilled in the art that the present invention may be embodied in many other specific forms without departing from the spirit or scope of the invention. Particularly, it should be understood that the present invention may be embodied in the following forms.

The method for forming the plating layer 23 (refer to FIG. 1C) may be changed. For example, plating may be performed by holding the frame base material 11 between masks including openings formed where the frame base material 11 should be plated. For example, as illustrated in FIG. 1A, when the outer leads 18 are formed between openings in the frame base material 11, the frame base material 11 may be held between a mask covering the upper surface of the frame base material 11 and a mask including openings corresponding to the openings between the outer leads 18 to plate the lower surface 11*a* and the side surfaces 11*b* and 11*c* of the frame base material 11 without plating the upper surface of the frame base material 11. Although there is no restriction, it is preferable that a mask be prepared for each of the first to third plating layers 24 to 26 of the plating layer 23.

The connection lead 16 that includes the plating layer 23 may be applied to a lead frame that does not have a die pad and/or to a semiconductor device.

Figure 6:
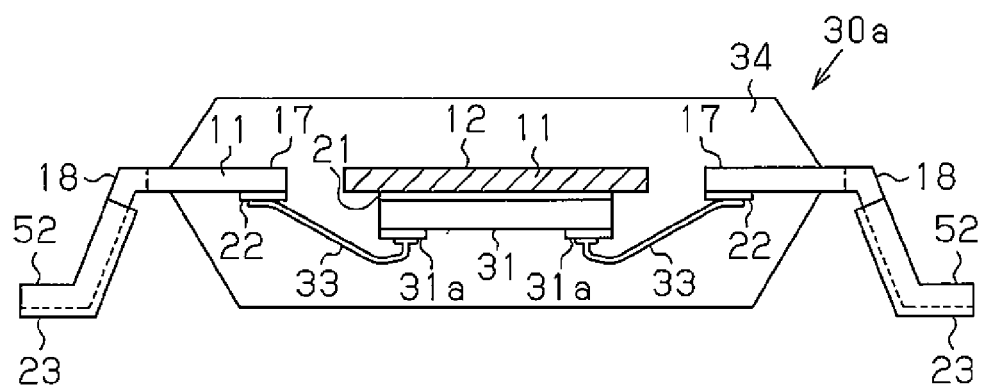
FIG. 6 is a schematic cross-sectional view of a further example of a semiconductor device.

The structure of the semiconductor device 30 may be changed. In the example illustrated in FIG. 6, a semiconductor device 30*a* includes a semiconductor element 31 connected to a lower surface of a die pad 12. An inner terminal 22 is formed on a distal lower surface of each inner lead 17. Each outer lead 18 includes a plating layer 23 that covers the lower surface of a frame base material 11 located on the same side as the distal lower surface of the inner lead 17 on which the inner terminal 22 is formed and the side surfaces of the frame base material 11. In the same manner as the illustrated embodiment described above, the semiconductor device 30*a* also allows for the formation of a satisfactory fillet and limits decreases in the connection reliability. Further, the plating layer 23 is formed only where necessary. Thus, increases in the resistance of the connection lead 16 are limited, decreases in the signal quality are limited, and high-quality signal transmission is enabled.

The number and material of the plating layer 23 partially covering the outer lead 18 may be changed.

In the illustrated embodiment described above, the distal end of the outer lead 18 does not have to be connected to the rail 13 or the inner frame 19.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although embodiments of the present invention have been described in detail, it should be understood that various changes, substitutions, and alterations could be made hereto without departing from the spirit and scope of the invention.

The invention claimed is:

1. A lead frame comprising:
   a frame base material including connection leads and a dam bar connecting the connection leads, wherein each connection lead includes an inner lead, which is located at an inner side of the dam bar, and an outer lead, which is located at an outer side of the dam bar; and
   a plating layer that covers either one of an upper surface and a lower surface of each outer lead and side surfaces of each outer lead, wherein the frame base material is exposed from the plating layer at the other one of the upper surface and the lower surface of each outer lead, the plating layer covering each side surface from a lower end to an upper end of the side surface.

2. The lead frame according to claim 1, wherein
   the frame base material is copper or copper alloy, and
   an oxide layer is formed on a surface of the frame base material exposed from the plating layer.

3. The lead frame according to claim 1, wherein each outer lead includes a junction to be bonded to a mount subject by solder to mount a semiconductor device on the mount subject, and the plating layer is formed in correspondence with the junction.

4. The lead frame according to claim 1, further comprising an inner terminal, formed on either the upper surface or the lower surface of each inner lead at a distal end of the inner lead, for connecting the inner lead to a semiconductor element,
   wherein the plating layer is formed on the surface of each outer lead that is located on an opposite side of the surface of the inner lead where the inner terminal is formed and on the side surfaces of the outer lead.

5. The lead frame according to claim 1, further comprising an inner terminal, formed on either the upper surface or the lower surface of each inner lead at a distal end of the inner lead, for connecting the inner lead to a semiconductor element,
   wherein the plating layer is formed on the surface of each outer lead that is located on the same side as the surface of the inner lead where the inner terminal is formed and on the side surfaces of the outer lead.

6. The lead frame according to claim 1, wherein the plating layer has a three-layer structure including
a first plating layer formed on the frame base material and made of Ni or an Ni alloy,
a second plating layer formed on the first plating layer and made of Pd or a Pd alloy, and
a third plating layer formed on the second plating layer and made of Au or an Au alloy.

7. The lead frame according to claim 1, wherein
each outer lead includes a first portion for forming a first bent portion and a second portion for forming a second bent portion, wherein the first portion is set at a level where the dam bar is located,
the plating layer extends from a distal end of each outer lead toward the corresponding inner lead, and
the plating layer covers the other one of the upper surface and the lower surface of each outer lead at least between the first portion and the second portion.

8. A semiconductor device comprising:
a semiconductor element;
an encapsulation resin that encapsulates the semiconductor element; and
connection leads extending out of the encapsulation resin, wherein each connection lead includes a distal portion functioning as a junction to be connected to a connection subject,
each junction includes a lower surface and side surfaces covered by a plating layer,
each junction includes an upper surface exposed from the plating layer so as to expose a frame base material,
the frame base material is copper or copper alloy,
the plating layer covers each side surface of each connection lead from a lower end to an upper end of the side surface, and
an oxide layer is formed on a surface of the frame base material exposed from the plating layer.

9. The semiconductor device according to claim 8, wherein
each connection lead includes an outer lead including a leg formed between a first bent portion and a second bent portion;
the junction of each connection lead is a distal portion of the outer lead extending from the second bent portion to a distal end of the outer lead; and
the plating layer covers the leg continuously from the junction.

10. A lead frame comprising:
an outer lead including
a lower surface formed to be bonded to a bonding subject,
an upper surface opposite to the lower surface, and
a side surface located between the lower surface and the upper surface; and
a plating layer that covers the lower surface and the side surface of the outer lead but not the upper surface of the outer lead, wherein the plating layer covers the side surface of the outer lead from a lower end to an upper end of the side surface of the outer lead and has an upper end that is flush with the upper surface of the outer lead.

11. The lead frame according to claim 10, wherein
the upper surface, the lower surface, and the side surface of the outer lead respectively include an upper surface, a lower surface, and a side surface of a distal junction of the outer lead;
the plating layer covers the lower surface and the side surface of the distal junction but not the upper surface of the distal junction; and
the upper end of the plating layer is flush with the upper surface of the distal junction.

12. The lead frame according to claim 10, wherein the upper surface of the outer lead that is not covered by the plating layer is covered by an oxidized film.

13. The lead frame according to claim 10, wherein the plating layer continuously extends from a distal end of the outer lead toward a basal end of the outer lead.

14. A structure for mounting a semiconductor device on a substrate, the structure comprising a connection lead of the semiconductor device bonded to a pad of the substrate with solder, wherein
the connection lead includes
a junction bonded to the pad and including side surfaces,
first and second bent portions that forms a leg therebetween, and
a plating layer that covers the side surfaces of the junction from a lower end to an upper end of each side surface of the junction, the plating layer covering the leg continuously from the junction,
the junction includes an upper surface exposed from the plating layer so as to expose a frame base material,
the solder rises along the side surfaces of the junction and reaches the upper end of each side surface, and
the solder rises along a lower surface of the leg.

* * * * *